(12) United States Patent
Shih et al.

(10) Patent No.: US 7,582,526 B2
(45) Date of Patent: Sep. 1, 2009

(54) METHOD FOR MANUFACTURING SEMICONDUCTOR DEVICE

(75) Inventors: Yen-Hao Shih, Hsinchu (TW); Erh-Kun Lai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 201 days.

(21) Appl. No.: 11/445,870

(22) Filed: Jun. 2, 2006

(65) Prior Publication Data
US 2007/0281423 A1 Dec. 6, 2007

(51) Int. Cl.
*H01L 21/336* (2006.01)
(52) U.S. Cl. .................. 438/257; 438/261; 438/288; 257/288; 257/314
(58) Field of Classification Search .......... 438/257, 438/261, 288, 301, 314; 257/288, 314, 315, 257/317, E21.584
See application file for complete search history.

(56) References Cited

U.S. PATENT DOCUMENTS

| | | | |
|---|---|---|---|
| 6,541,816 B2 | 4/2003 | Ramsbey et al. ............ 257/324 |
| 6,610,586 B1 | 8/2003 | Liu ............................ 438/526 |
| 6,787,416 B2 | 9/2004 | Kuo et al. ................... 438/258 |
| 6,803,279 B2 | 10/2004 | Eitan ........................ 438/261 |
| 6,828,197 B1 * | 12/2004 | Lai ............................. 438/275 |
| 6,933,197 B2 * | 8/2005 | Iida ........................... 438/264 |
| 2004/0033664 A1 * | 2/2004 | Park ........................... 438/264 |
| 2006/0261398 A1 * | 11/2006 | Lee .............................. 257/314 |

* cited by examiner

*Primary Examiner*—Phuc T Dang
(74) *Attorney, Agent, or Firm*—J.C. Patents

(57) ABSTRACT

A method for manufacturing a plurality of memory devices and a plurality of high voltage devices on a substrate are provided. The substrate has a memory region and a high voltage region. The method comprises steps of forming a first dielectric layer on the substrate and then performing a thermal process so as to enlarge the thickness of the first dielectric layer in the high voltage region. A buried diffusion region is formed in the substrate in the memory region and a charge trapping layer and a blocking dielectric layer are formed over the substrate in the memory region. A patterned conductive layer is formed over the substrate so as to form gates the memory region and the high voltage region respectively and then a source/drain region is formed adjacent to the gates in the high voltage region in the substrate.

9 Claims, 3 Drawing Sheets

METHOD FOR MANUFACTURING SEMICONDUCTOR DEVICE

BACKGROUND OF THE INVENTION

1. Field of Invention

The present invention relates to a method for manufacturing a semiconductor device. More particularly, the present invention relates to a method for manufacturing a plurality of memory devices together with a plurality of high voltage devices and a plurality of low voltage devices.

2. Description of Related Art

Generally, on the same chip, some of the integrated circuits need both low voltage devices and high voltage devices. For example, the erasable programmable ROM (EPROM) needs high voltage transistors to perform the programming operations and the low voltage transistor for logic operations. Since the high voltage devices and the low voltage devices need different supply voltage, the thicknesses of the gate dielectric layers of the high voltage devices and the low voltage devices are different from each other. For the high voltage devices, the thickness of the gate dielectric layer should be large enough to sustain the relatively high applied voltage. On the other hand, for the low voltage devices, the thickness of the gate dielectric layer is relatively small. Furthermore, for the memory, the thickness of the tunnel dielectric layer is relatively small as well.

With the increasing of the demands for the smaller and smaller devices, the challenge for shrinking down the size of the memory is high. Conventionally, after the buried diffusion region for the memory is formed in the substrate, the high thermal budget of the later performed process, such as the formation of the relatively thick dielectric layer, seriously affects the size of the buried diffusion region. That is, the relatively high temperature leads to the extension of the buried diffusion region. Therefore, it is hard to control the device characteristics of the memory. Accordingly, how to well control the size of the buried diffusion region of the memory without being enlarged during the process procedure becomes a main task for the present technology development.

SUMMARY OF THE INVENTION

Accordingly, at least one objective of the present invention is to provide a method for forming a memory together with a high voltage device and a low voltage device. By using the method according to the present invention, the buried diffusion region formed in the substrate is not affected by the high thermal budget of the thermal process for the formation of the thick dielectric layer of the high voltage device.

At least another objective of the present invention is to provide a method for forming a memory together with a high voltage device. By using the method according to the present invention, the shrinkage of the memory device is well controlled and the process cost is low as well.

To achieve these and other advantages and in accordance with the purpose of the invention, as embodied and broadly described herein, the invention provides a method for manufacturing a memory together with at least a high voltage device and a low voltage device. A substrate having a memory region and a peripheral region is provided, and the peripheral region has a high voltage region and a low voltage region. At least a dielectric layer is formed on the substrate, and the thickness of a portion of the dielectric layer in the high voltage region is larger than the thickness of a portion of the dielectric layer in the low voltage region, and is larger than the thickness of a portion of the dielectric layer in the memory region. A buried diffusion region is formed in the substrate in the memory region. A charge trapping layer and a blocking dielectric layer are formed over the substrate in the memory region. A patterned conductive layer is formed over the substrate so as to form a first gate, a second gate and a third gate in the high voltage region, the low voltage region, and the memory region, respectively. A source/drain region is formed adjacent to the first gate in the high voltage region and adjacent to the second gate in the low voltage region in the substrate.

According to the embodiment described above, the step for forming the buried diffusion region in the substrate comprises steps of forming a first patterned photoresist layer over the substrate to expose a portion of the dielectric layer in the memory region and then performing an implantation process to form the buried diffusion region in a portion of the memory region of the substrate under a portion of the dielectric layer exposed by the first patterned photoresist layer.

According to the embodiment described above, the step of forming the charge trapping layer and the blocking dielectric layer comprises steps of forming a charge trapping material over the substrate and then forming a dielectric material over the charge trapping material. A second patterned photoresist layer is formed over the substrate to expose a portion of the dielectric material above the dielectric layers on peripheral regions. The exposed dielectric material on the peripheral region is removed until the charge trapping material is exposed. Then, the second patterned photoresist layer is removed. The remaining portion of the dielectric material in the memory region is used as a mask to remove the exposed charge trapping material in the peripheral region. A portion of the first dielectric layer and a portion of the second dielectric layer on the peripheral region are exposed.

The present invention further provides a method for manufacturing a memory device together with at least a high voltage device on a substrate, wherein the substrate has a memory region and a high voltage region. The method comprises steps of forming a first oxide layer on the substrate and then performing a thermal process so as to enlarge the thickness of a portion of the first oxide layer in the high voltage region. A buried diffusion region is formed in the substrate in the memory region after the thermal process is performed and a nitride layer and a blocking oxide layer are formed over the substrate in the memory region. A patterned conductive layer is formed over the substrate so as to form a first gate and a second gate in the high voltage region and the memory region respectively and then a source/drain region is formed adjacent to the first gate in the high voltage region in the substrate.

According to the embodiment described above, the step for forming the buried diffusion region in the substrate comprises steps of forming a first patterned photoresist layer over the substrate to expose a portion of the first oxide layer in the memory region and then performing an implantation process to form the buried diffusion region in a portion of the memory region of the substrate under the exposed portion of the first oxide layer. The first patterned photoresist layer is removed until the first oxide layer is exposed.

According to the embodiment described above, the step of forming the nitride layer and the blocking oxide layer comprises steps of forming a nitride material over the substrate and forming a LPCVD oxide material over the nitride material. A second patterned photoresist layer is formed over the substrate to expose a portion of the oxide material in the peripheral region. Then, the exposed oxide material in the peripheral region is removed until the nitride material is exposed. The second patterned photoresist layer is removed. The remaining portion of the oxide material in the memory region is as a mask to the exposed nitride material until a portion of the first oxide layer in the peripheral region is exposed.

In the present invention, since the buried diffusion region is formed after the first dielectric layer/first oxide layer in the high voltage region by performing the thermal process, the buried diffusion region is not extended by the high process temperature of the thermal process. Moreover, after the buried diffusion region is formed in the substrate, the thermal budget of the later performed process is relatively low so that the reliability of the buried diffusion region is relatively better. Therefore, the shrinkage of the memory size can be well controlled without being damaged by the thermal process for forming the thick dielectric layer of the high voltage device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 1A through 1F are cross-sectional views schematically illustrating a method of manufacturing a memory together with a high voltage device and a low voltage device according to a preferred embodiment of the invention.

Figure 1A:
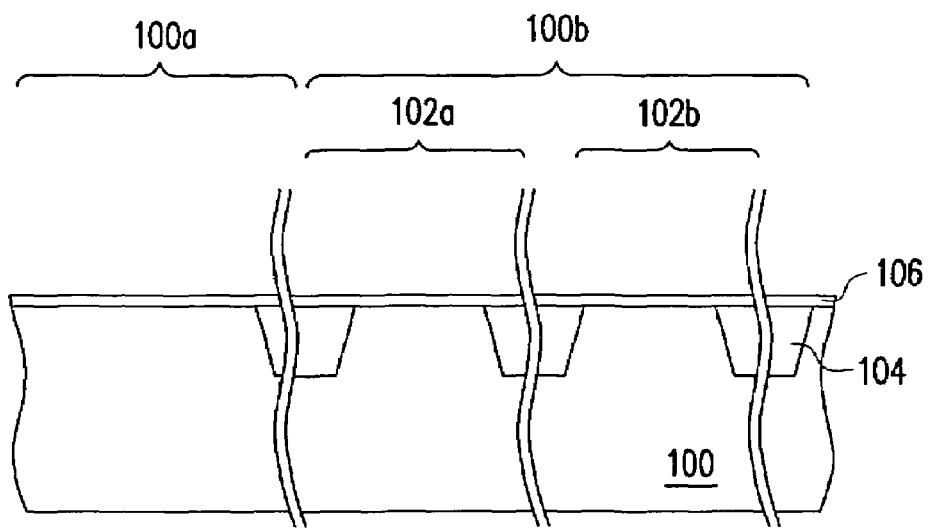
FIGS. 1A through 1F are cross-sectional views schematically illustrating a method of manufacturing a memory together with a high voltage device and a low voltage device according to a preferred embodiment of the invention.

As shown in FIG. 1A, a substrate 100 is provided. The substrate 100 comprises a memory region 100a and a peripheral region 100b. Further, the peripheral region 100b further comprises a high voltage region 102a and a low voltage region 102b. In the present embodiment, the memory region 100a, the high voltage region 102a and the low voltage region 102b are separated from each other by an isolation structure 104. However, the invention is not limited by this configuration. In practice, the memory region, the high voltage region and the low voltage region can be formed within different well with different conductive type and are isolated from each other by the well. The substrate 100 can be, for example but not limited to, a silicon substrate. A dielectric layer 106 is formed over the substrate 100. The dielectric layer can be, for example but not limited to, an oxide layer.

Figure 1B:
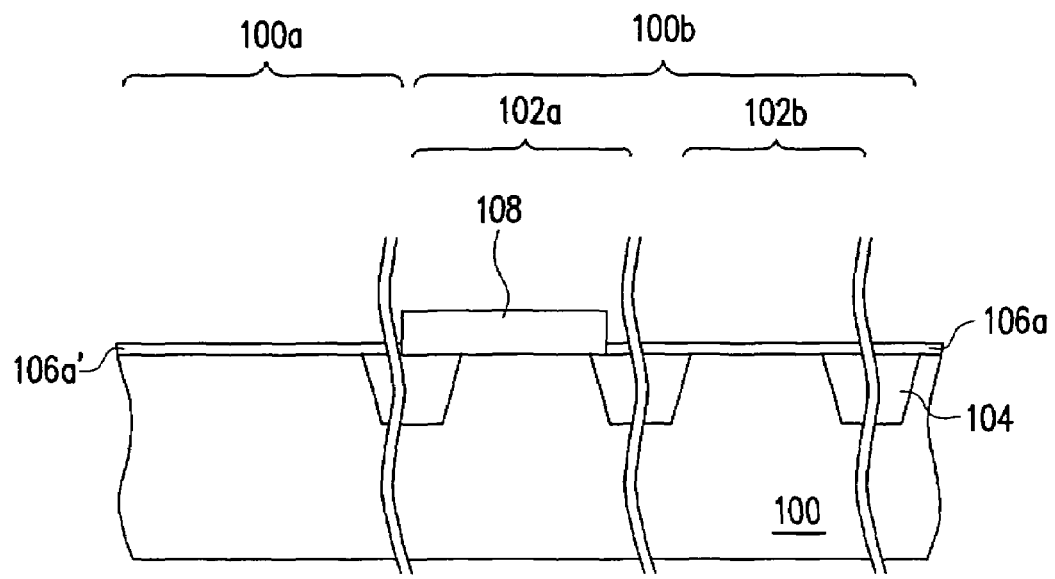

As shown in FIG. 1B, a portion of the dielectric layer 106 is removed in memory region 100a and low voltage region 102b. Then, a thermal process is performed to enlarge a portion of the dielectric layer 106 in the high voltage region 102a so as to transform the dielectric layer 106 to be a dielectric layer 108 in high voltage region 102a. A dielectric layer 106a' in memory region 100a and a dielectric layer 106a in the low voltage region 102b are formed simultaneously with dielectric layer 108 during the thermal process. The thermal process is performed under a temperature of about 800~1000° C.

Figure 1C:
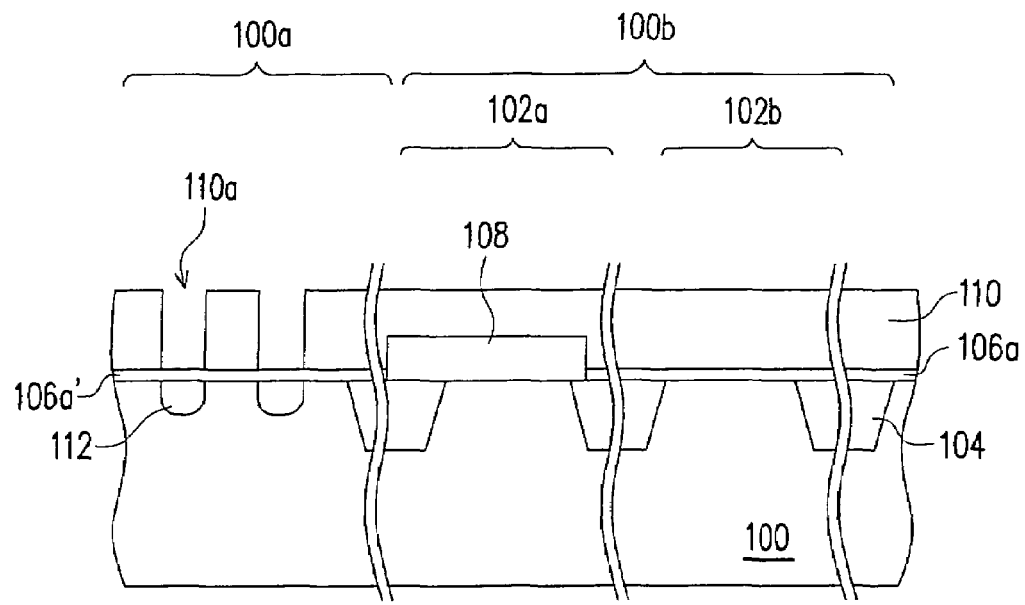

As shown in FIG. 1C, a patterned mask layer 110 with a pattern 110a is formed over the substrate 100. The pattern 110a exposes a portion of the dielectric layer 106a' in the memory region 100a. The patterned mask layer 110 can be, for example but not limited to, a patterned photoresist layer. In the substrate 100 under the exposed portion of the dielectric layer 106a', a buried diffusion region 112 is formed. For example, in the formation of buried diffusion region 112, a P-pocket is implanted into the substrate 100 through dielectric layer 106a' by using the patterned mask layer as a mask and then the buried diffusion lines or source/drain regions are formed in the substrate 100. The P-pocket can be, for example, formed by performing an implantation process with use of a dopant such as boron at the energy no more than 100 Kev. Furthermore, the diffusion lines/source/drain regions can be, for example, formed by performing an implantation process with use of a dopant such as As or P at the energy no more than 50 Kev.

Figure 1D:
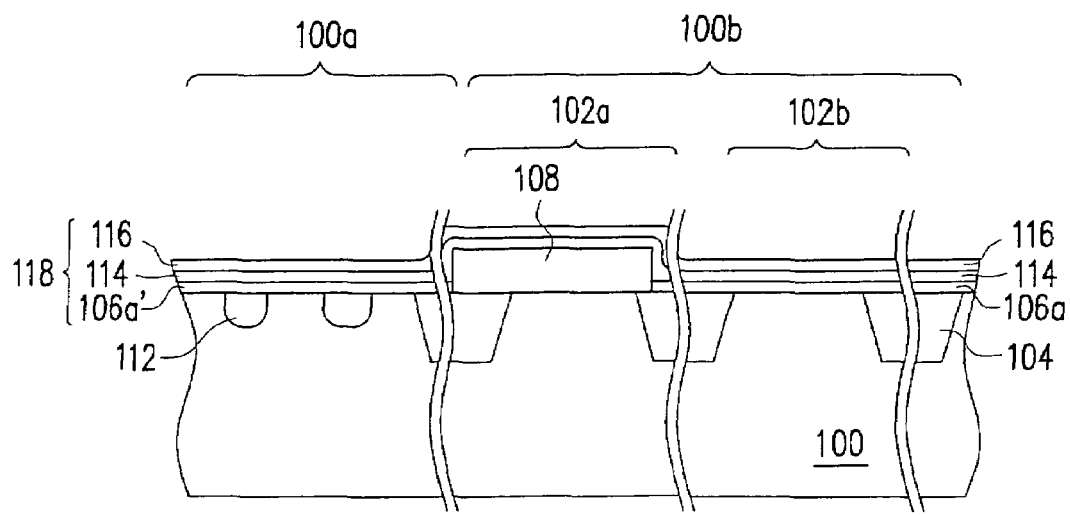

As shown in FIG. 1D, the patterned mask layer 110 is removed. Then, a charge trapping layer 114 is formed over the substrate 100. The charge trapping layer 114 can be, for example but not limited to, a nitride layer. The charge trapping layer 114 can be, for example, formed at a temperature of about 680° C. Moreover, a blocking dielectric layer 116 is formed on the charge trapping layer 114. The blocking dielectric layer 116 can be, for example but not limited to, an oxide layer. The blocking dielectric layer 116 can be, for example, formed at a temperature of about 780° C.

Figure 1E:
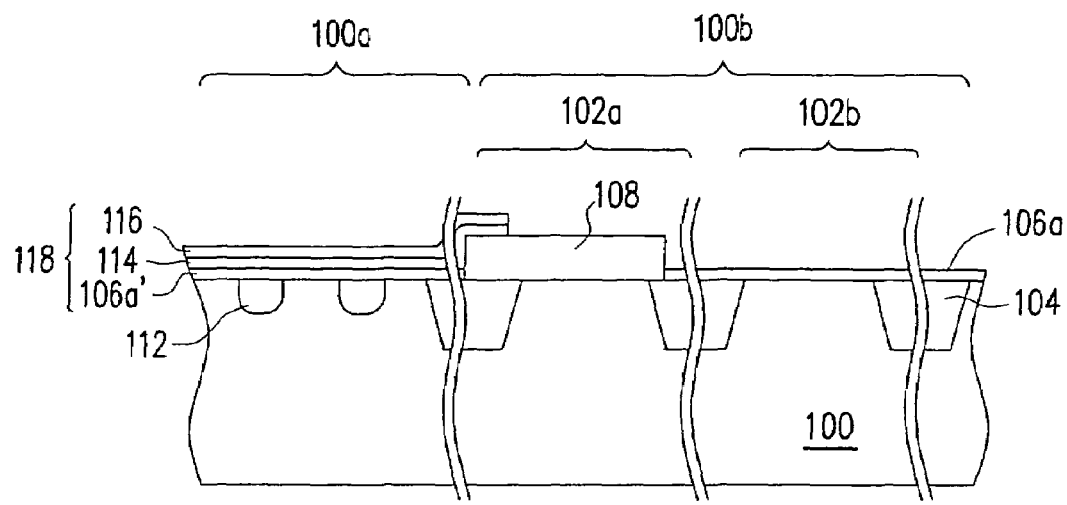

As shown in FIG. 1E, the portion of the blocking dielectric layer 116 and the charge trapping layer 114 in the peripheral region 100b are removed to expose the dielectric layer 108 and the dielectric layer 106a. In the method for removing the portion of the blocking dielectric layer 116 and the charge trapping layer 114, a patterned photoresist layer (not shown) is formed over the substrate 100 to expose a portion of the blocking dielectric layer 116 on the peripheral region 100b. Then, the exposed portion of the blocking dielectric layer 116 is removed by a first etching process to expose a portion of the charge trapping layer 114 in the peripheral region 100b. In one embodiment, the first etching process is a wet etching process with diluted hydrogen fluoride. The first etching process has an etching selectivity ratio of oxide to nitride of about 5~50. Therefore, the etching rate of the oxide material is larger than that of the nitride layer. Hence, the first etching process is stop at the charge trapping layer 114. Thereafter, the patterned photoresist layer is removed to expose the remaining portion of the blocking dielectric layer 116 in the memory region 100a. Then, a second etching process is performed to remove the exposed portion of the charge trapping layer 114 on the peripheral region 100b to expose the dielectric layer 108 and the dielectric layer 106a. In the method for removing the exposed portion of the charge trapping layer 144, the remaining blocking dielectric layer 116 in the memory region 100a is used as an etching mask. Therefore, in the memory region, the blocking dielectric layer 116, the charge trapping layer 114 and the dielectric layer 106a' together form a charge trapping structure 118. The second etching process has an etching selectivity ratio of nitride to oxide of about 5~50. In one embodiment, the hot phosphoric acid is used in the second etching process to remove charge trapping layer 114.

Figure 1F:
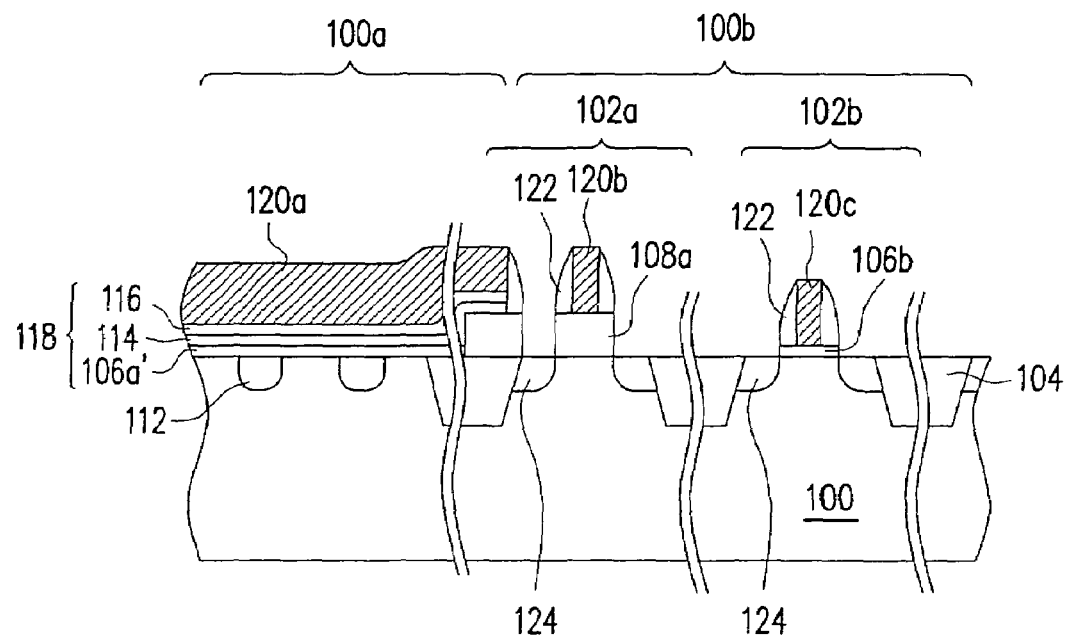

As shown in FIG. 1F, a patterned conductive layer is formed over the substrate 100 so as to form a gate 120a, a gate 120b and a gate 120c on the charge trapping structure 118, the dielectric layer 108 and the dielectric layer 106a respectively. Then, a spacer 122 is formed on the sidewall of the gate 120b and 120c. Moreover, a portion of the dielectric layer 108 and the dielectric layer 106a exposed by the gates 120b and 120c and the spacer 122 is removed to expose a portion of the substrate 100. Meanwhile, the dielectric layer 108 and the dielectric layer 106a are transformed into a gate dielectric layer 108a and the gate dielectric layer 106b for the high voltage device and the low voltage device respectively. Thereafter, a source/drain region 124 is formed in the substrate 100 adjacent to the gates 120b and 120c. Accordingly, a memory, a high voltage device and the low voltage device are formed in the memory region 100a, the high voltage region 102a and the low voltage region 102b respectively.

In the present invention, since the buried diffusion region is formed after the gate dielectric layer for the high voltage device is formed in the high voltage region by performing the thermal process, the buried diffusion region is not affected by the thermal process. That is, the buried diffusion region is not extended because of the high process temperature of the thermal process. Therefore, the shrinkage of the memory size can be well controlled without being damaged by the thermal process for forming the gate dielectric layers of the high voltage/low voltage device. After the buried diffusion region is formed in the substrate, the thermal budget of the later performed process is relatively low so that the reliability of the buried diffusion region is relatively better. Furthermore, in the steps of removing the topmost dielectric layer and the charge trapping layer on the peripheral region, because the etching processes including the first etching process and the second etching process with high etching selectivity property are applied in the etching process in sequence, the topmost dielectric layer and the charge trapping layer in the peripheral region are removed individually. Also, it is unnecessary to perform a further planarization process. Therefore, the process cost is low.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a memory device together with at least a high voltage device and a low voltage device, comprising:
    providing a substrate having a memory region and a peripheral region, wherein the peripheral region has a high voltage region and a low voltage region;
    forming a dielectric layer on the substrate, comprising:
    forming a dielectric material layer in the high voltage region and the low voltage region; and
    performing a thermal process to enlarge the dielectric material layer in the high voltage region,
    wherein a first thickness of a portion of the dielectric layer in the high voltage region is larger than a second thickness of a portion of the dielectric layer in the low voltage region;
    forming a buried diffusion region in the substrate in the memory region;
    forming a charge trapping layer and a blocking dielectric layer over the substrate in the memory region after the step of forming the buried diffusion region;
    forming a patterned conductive layer over the substrate so as to form a first gate, a second gate and a third gate in the high voltage region, the low voltage region, and the memory region respectively; and
    forming a source/drain region adjacent to the first gate in the high voltage region and adjacent to the second gate in the low voltage region in the substrate.

2. The method of claim 1, wherein the step for forming the buried diffusion region in the substrate comprises:
    forming a first patterned photoresist layer over the substrate to expose a portion of the dielectric layer in the memory region; and
    performing an implantation process to form the buried diffusion region in a portion of the memory region of the substrate under a portion of the dielectric layer exposed by the first patterned photoresist layer.

3. The method of claim 1, wherein the step of forming the charge trapping layer and the blocking dielectric layer comprises:
    forming a charge trapping material over the substrate;
    forming a dielectric material over the charge trapping material;
    forming a second patterned photoresist layer over the substrate to expose a portion of the dielectric material in the peripheral region;
    removing the exposed dielectric material in the peripheral region until the charge trapping material is exposed;
    removing the second patterned photoresist layer; and
    removing the exposed charge trapping material in the peripheral region by using the remaining dielectric material in the memory region as a mask until a portion of the dielectric layer in the peripheral region is exposed.

4. The method of claim 3, wherein the step of removing the exposed dielectric material in the peripheral region is accomplished by performing a first etching process with the use of a first etchant.

5. The method of claim 4, wherein the first etchant possesses an etching selectivity ratio of oxide to nitride of about 5~50.

6. The method of claim 3, wherein the charge trapping material is a nitride layer.

7. The method of claim 3, wherein the dielectric material is an oxide layer.

8. A method for manufacturing a memory device together with at least a high voltage device and a low voltage device, comprising:
    providing a substrate having a memory region and a peripheral region, wherein the peripheral region has a high voltage region and a low voltage region;
    forming a dielectric layer on the substrate, wherein a first thickness of a portion of the dielectric layer in the high voltage region is larger than a second thickness of a portion of the dielectric layer in the low voltage region;
    forming a buried diffusion region in the substrate in the memory region;
    forming a charge trapping layer and a blocking dielectric layer over the substrate in the memory region after the step of forming the buried diffusion region;
    forming a patterned conductive layer over the substrate in the periphery region and over the blocking dielectric layer in the memory region so as to form a first gate, a second gate and a third gate in the high voltage region, the low voltage region, and the memory region, respectively; and
    forming a source/drain region adjacent to the first gate in the high voltage region and adjacent to the second gate in the low voltage region in the substrate.

9. The method of claim 8, wherein the step for forming the buried diffusion region in the substrate comprises:
    forming a first patterned photoresist layer over the substrate to expose a portion of the dielectric layer in the memory region; and
    performing an implantation process to form the buried diffusion region in a portion of the memory region of the substrate under a portion of the dielectric layer exposed by the first patterned photoresist layer.

* * * * *